(12) United States Patent
Nakao

(10) Patent No.: US 6,171,662 B1
(45) Date of Patent: Jan. 9, 2001

(54) METHOD OF SURFACE PROCESSING

(75) Inventor: Shuji Nakao, Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/208,480

(22) Filed: Dec. 10, 1998

Related U.S. Application Data

(62) Division of application No. 08/711,330, filed on Sep. 6, 1996, now Pat. No. 5,868,849.

(30) Foreign Application Priority Data

Apr. 1, 1996 (JP) .................................................. 8-078885

(51) Int. Cl.$^7$ .................................................. C23C 16/00
(52) U.S. Cl. ........................ 427/595; 427/99; 427/255.28; 438/706; 438/707
(58) Field of Search .......................... 427/248.1, 255.11, 427/255.23, 255.27, 255.28, 508, 509, 575, 578, 595, 99; 438/706, 707

(56) References Cited

U.S. PATENT DOCUMENTS

| | | |
|---|---|---|
| 4,883,686 | 11/1989 | Doehler et al. . |
| 4,983,254 | 1/1991 | Fujimura et al. . |
| 5,010,842 | 4/1991 | Oda et al. . |
| 5,030,319 | 7/1991 | Nishino et al. . |
| 5,041,303 * | 8/1991 | Wertheimer et al. ................ 427/575 |
| 5,148,021 | 9/1992 | Okamoto et al. . |
| 5,223,308 * | 6/1993 | Doehler ................................ 427/575 |
| 5,403,436 * | 4/1995 | Fujimura et al. ................... 427/539 |
| 5,462,899 | 10/1995 | Ikeda . |
| 5,525,550 * | 6/1996 | Kato .................................... 437/238 |
| 5,565,679 | 10/1996 | Tanner et al. . |
| 5,585,148 * | 12/1996 | Suzuki et al. ....................... 427/583 |
| 5,635,144 | 6/1997 | Aklufi . |
| 5,702,530 | 12/1997 | Shan et al. . |

OTHER PUBLICATIONS

Webster's II New Riverside University Dictionary, Houghton Mifflin Company, 1994, p. 1256.*
Morosanu, C.E., "Thin Films by Chemical Vapor Deposition". Elsevier, Amsterdam, 1990, pp.48–49.*

* cited by examiner

Primary Examiner—Shrive Beck
Assistant Examiner—Bret Chen
(74) Attorney, Agent, or Firm—McDermott, Will & Emery

(57) ABSTRACT

A surface is processed by a method comprising: supplying a first gas, e.g. TEOS, through a passage disposed near a surface of a wafer, the first gas being insusceptible to heating by microwave; and supplying a second gas, susceptible to heating be microwave, e.g., $H_2O$, through a passage disposed near the wafer surface. A microwave generating unit disposed near the wafer surface irradiates TEOS supplied from the first supplying passage and $H_2O$ gas supplied from the second gas supplying passage with microwave, selectively heating only $H_2O$ so that TEOS reacts with $H_2O$ to form an $SiO_2$ film on the wafer surface. The inventive method enables precise control of the CVD reaction to form a thin film having good step coverage.

12 Claims, 3 Drawing Sheets

METHOD OF SURFACE PROCESSING

This application is a divisional of application Ser. No. 08/711,330 filed Sep. 6, 1996 now U.S. Pat. No. 5,868,849.

BACKGROUND OF THE INVENTION

1. Field of the Invention

The present invention relates to a surface processing device and a method of processing a surface. It particularly relates to a surface processing device and a method of processing a surface which contemplate improvement in processing a surface of an object to be processed.

2. Description of the Background Art

Conventionally in the process for manufacturing semiconductor devices, various types of surface processing are performed, typically including film forming and etching. The film forming process includes the CVD method and sputtering.

An example of a conventional plasma CVD system will now be described with reference to FIG. 5.

A conventional plasma CVD system 300 has an electrode 306 and a holder electrode 308 contained opposite to each other within an evacuated container 304 which is evacuated by an evacuating device 312. Holder electrode 308 is grounded. Mounted on holder electrode 308 is a substrate 302 to the surface of which film forming process is applied. Substrate 302 is heated, for example, by a heater 310 within holder electrode 308.

A raw material gas 320 is introduced into evacuated container 304 via gas introducing portion 314 communicating with electrode 306. As raw material gas 320, $SiH_4$ (silane) $+H_2O$ is used, and recently, TEOS (tetraethoxysilane) $+H_2O$ or the like has come to be used in view of processing at lower temperature and for planarization of silicon oxide films.

In plasma CVD system 300, gas introducing portion 314 is supplied with TEOS from a gas source 322 and $H_2O$ from a gas source 324. Furthermore, mass flow controllers 326 and 328 are provided at supplying passages of TEOS and $H_2O$, respectively, and a heater 330 for vaporizing TEOS is also provided at the TEOS supplying passage.

Radio frequency (RF) power is supplied to the space between electrode 306 and holder electrode 308 from an RF generator 318 via a matching box 316. A continuous sign wave is used for the RF power and its frequency is generally 13.56 MHz.

In such a plasma CVD system, when raw material gas 320 as described above is introduced into evacuated container 304 to obtain a degree of vacuum, for example, of several hundred mTorr within evacuated container 304 while RF power is supplied to electrode 306 from RF generator 318, RF electric discharge is generated between electrodes 306 and 308, causing plasma 332 therebetween.

At that time, electrons are trapped in a blocking capacitor, which is generally contained in matching box 316, so that electrode 306 is negatively charged. This causes positive ions in plasma 332 to accelerate toward and collide against electrode 306 and electrons are thereby generated to maintain plasma 332.

Thus, due to plasma 332, raw material gas 320 is activated and chemical reactions proceed whereby a silicon oxide ($SiO_2$) film is formed on a surface of substrate 302.

The reaction between the TEOS and $H_2O$ described above can be expressed by the following chemical formulas:

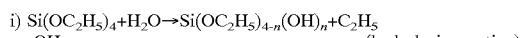
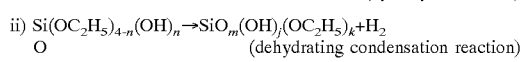
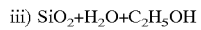

TEOS=$Si(OC_2H_5)_4$
silanol=$Si(OC_2H_5)_{4-n}(OH)_n$
silicon polymer=$SiO_m(OH)_j(OC_2H_5)_k$ In the system of reaction between TEOS and $H_2O$, silanol is first produced by the hydrolysis reaction expressed by chemical formula (i). Then, by the dehydrating condensation reaction expressed by chemical formula (ii), silicon polymer having an appropriate molecular weight is produced from the silanol as an intermediate. The silicon polymer adheres to a surface of an object to be processed and is fluidized to realize a planarized film formed on the substrate surface. Thereafter, as expressed by chemical formula (iii), the silicon polymer also dehydrates to produce $SiO_2$ and thus $SiO_2$ film is formed on the substrate surface.

However, in the reactions in the above plasma CVD system, since a chemical reaction is caused by electrons of several eV, the molecules of the raw material gases are decomposed into many kinds of molecules. This practically makes it difficult to selectively cause only the above desired reactions.

In forming a $SiO_2$ film by reaction between TEOS and $H_2O$, it is important to produce silanol by reacting TEOS, the molecular structure of which is kept intact, with $H_2O$ maintained at high temperature.

However, while the decomposition of the new material gases by plasma partially excites reaction (i), Si and SiO produced by decomposition of TEOS directly reacts with O produced by decomposition of $H_2O$, for example, causing a reaction dominantly producing $SiO_2$, rather than silanol, as the intermediate. Thus, it is not practically ensured that the films formed are adequately planarized by silicon polymer.

Furthermore, in the above plasma CVD system, since silanol is less produced and $SiO_2$ in gas phase dominantly adheres to the substrate surface, flatness of the films cannot be achieved without keeping the substrate at a low temperature of at most 120° C. and restraining the dehydrating condensation rate of the silanol.

Thus, since a $SiO_2$ film thus formed on a substrate maintained at low temperature has not experienced adequate reaction, it contains a large amount of OH group and has shortcomings such as large leakage current and low dielectric strength.

Furthermore, when heat treatment (300° C.–400° C.) is performed after the film formation to improve film quality, volumetric shrinkage is caused and thus tensile stress is caused, resulting in cracks or the like in the film.

SUMMARY OF THE INVENTION

One object of the present invention is to provide a surface processing device and a method of processing a surface capable of precisely controlling CVD reaction to form thin films with good step coverage, which is required, for example, for manufacturing semiconductor devices.

Another object of the present invention is to provide a surface processing device and a method of processing a surface capable of precisely etching a surface of an object to be processed in manufacturing semiconductor devices.

A surface processing device according to the present invention processes a surface of an object to be processed in an atmosphere under the atmospheric pressure. It includes:

a first gas supplying passage disposed near the surface of the object to be processed for supplying a first gas insusceptible to heating by electromagnetic wave; a second gas supplying passage disposed near the surface of the object to be processed for supplying a second gas susceptible to heating by electromagnetic wave; and an electromagnetic wave generating unit disposed near the surface of the object to be processed for irradiating the first gas supplied from the first gas supplying passage and the second gas supplied from the second gas supplying passage with electromagnetic wave and selectively heating only the second gas to cause reaction between the first gas and the second gas, thereby processing the surface of the object to be processed.

Preferably, a plurality of the first gas supplying passages and a plurality of the second gas supplying passages are alternately provided. Still preferably, the electromagnetic wave generating unit is a microwave generating unit.

When a gas containing TEOS is used as the first gas and a gas containing $H_2O$ is used as the second gas in the above surface processing device, for example, it is possible to selectively heat only the second gas, $H_2O$, near the surface of the object to be processed by microwave generated from the electromagnetic wave generating unit.

Thus, since dissociation of molecules of the first gas, i.e., TEOS, is hardly caused, it is ensured that the following reactions are caused:

i) $Si(OC_2H_5)_4 + H_2O \rightarrow Si(OC_2H_5)_{4-n}(OH)_n + C_2H_5OH$     (hydrolysis reaction)

ii) $Si(OC_2H_5)_{4-n}(OH)_n \rightarrow SiO_m(OH)_j(OC_2H_5)_k + H_2O$     (dehydrating condensation reaction)

iii) $SiO_2 + H_2O + C_2H_5OH$ $TEOS = Si(OC_2H_5)_4$
silanol $= Si(OC_2H_5)_{4-n}(OH)_n$
silicon polymer $= SiO_m(OH)_j(OC_2H_5)_k$ Consequently, it is ensured that silanol is produced as the intermediate and an $SiO_2$ film having adequate flatness can be formed. Furthermore, since the $SiO_2$ is continuously fired during the film formation, an $SiO_2$ film with small leakage current and good dielectric strength can be formed.

Furthermore, when a gas containing $F_2$ gas is used as the first gas and a gas containing $H_2O$ is used as the second gas, only the second gas, $H_2O$, can be selectively heated by microwave generated from the electromagnetic wave generating unit, causing the following reaction without using HF vapor:

$F_2 + H_2O \rightarrow HF + O_2$.

Thus, oxide films can be selectively etched safely, using HF anhydride.

Furthermore, the above surface processing device is provided with a gas mixing chamber for mixing the first gas supplied from the first gas supplying passage with the second gas supplied from the second gas supplying passage at the region of the outlets of the first and second gas supplying passages, the gas mixing chamber being provided with an electromagnetic wave generating unit. In this configuration, it is possible to cause the above reactions within the gas mixing chamber.

Still preferably, in the above surface processing device, the first and second gas supplying passages have their routes defined at their outlets by dielectric members capable of transmitting electromagnetic wave, an electromagnetic wave generating unit is provided in the region of the first and second gas supplying passages partitioned by the dielectric members, and ceramic, quarts or the like is used for the dielectric members.

With this structure, when there is a high reactivity between the first gas and the second gas, only the second gas can be preheated using the electromagnetic wave generating unit and thereafter the first and the second gases can be mixed to cause the above film forming and etching reactions or the like near the surface of the object to be processed.

A method of processing a surface according to the present invention includes, in a system including a supplying port disposed near a surface of an object to be processed for supplying a first gas insusceptible to heating by electromagnetic wave and a second gas susceptible to heating by electromagnetic wave, in an atmosphere under the atmospheric pressure, the steps of: selectively heating only the second gas by irradiating the first and second gases with electromagnetic wave; and processing the surface of the object to be processed by reaction between the first gas and the heated second gas.

Still preferably, the selective heating step is performed with the first gas and the second gas being separated. Still preferably, the first gas contains a first reactive gas which reacts on the second gas and the first carrier gas which does not react on the second gas, and the second gas contains a second reactive gas which reacts on the first gas and a second carrier gas which does not react on the first gas.

In the method of processing a surface described above, when TEOS as an organosilane compound is used as the first reactive gas, $H_2O$, is used as the second reactive gas and a noble gas is used as the first and second carrier gases, only the second reactive gas, $H_2O$, can be selectively heated, for example, by microwave generated from the electromagnetic wave generating unit.

Therefore, dissociation of molecules of the first reactive gas, TEOS, is hardly caused and thus the reactions i), ii) and iii) described above are surely performed.

As a result, it is ensured that silanol is produced as the intermediate and an $SiO_2$ film having good flatness can be formed. Furthermore, since the $SiO_2$ is continuously fired during the film formation, a $SiO_2$ film with small leakage current and good dielectric strength can be formed.

Furthermore, in the method of processing a surface described above, when a noble gas, such as argon and xenon, the mass numbers of which are larger than that of $H_2O$, is used as the second carrier gas, energy loss due to collision of the heated $H_2O$ molecules is reduced so that $H_2O$ may not be cooled and can thus reach the reaction space near the object to be processed.

On the other hand, when a gas containing $F_2$ gas is used as the first gas and a gas containing $H_2O$ is used as the second gas, only the second gas, $H_2O$, can be selectively heated by microwave generated from the electromagnetic wave generating unit, causing the following reaction without using HF vapor:

$F_2 + H_2O \rightarrow HF + O_2$.

Thus, it is possible to selectively etch an oxide film safely, using HF anhydride.

Furthermore, in the above method of processing a surface, the selective heating step is performed with the first gas being separated from the second gas.

This allows a stable, selective heating step even when there is a high reactivity between the first gas and the second gas.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

An embodiment in which a surface processing device according to the present invention is applied to a single-wafer-processing atmospheric pressure CVD system will now be described with reference to FIGS. 1–3.

Figure 1:
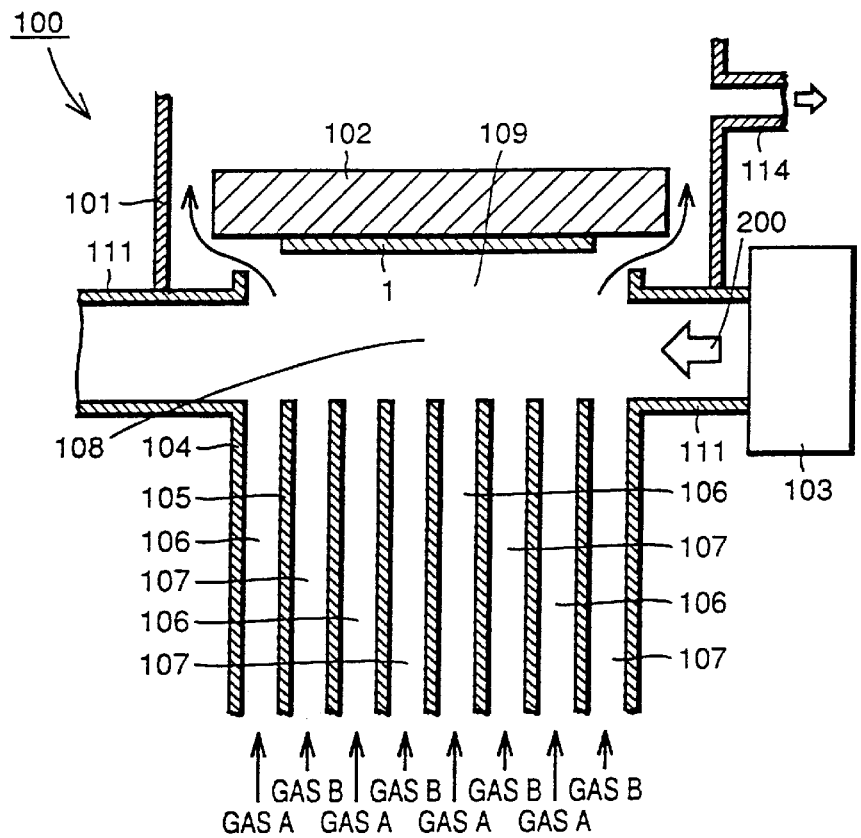
FIG. 1 is a cross sectional view of a CVD system according to a first embodiment.

Referring now to FIG. 1, the structure of an atmospheric pressure CVD system 100 in cross section will be described. Provided in a chamber 101 is a holder 102 which attracts a wafer 1 by evacuation and is internally provided with a heater and a cooler. Provided under holder 102 are a reactive gas lead-through port 109 and a gas reacting chamber 108.

Provided under gas reacting chamber 108 are gas A supplying passages 106 for supplying a gas A insusceptible to heating by electromagnetic wave to gas reacting chamber 108 and gas B supplying passages 107 for supplying a gas B susceptible to heating by electromagnetic wave to gas reactive chamber 108 such that these supplying passages are partitioned by diaphragms 105, thus providing a gas separating portion 104 in which gas A supplying passages 106 and gas B supplying passages 107 are alternately disposed.

Figure 2:
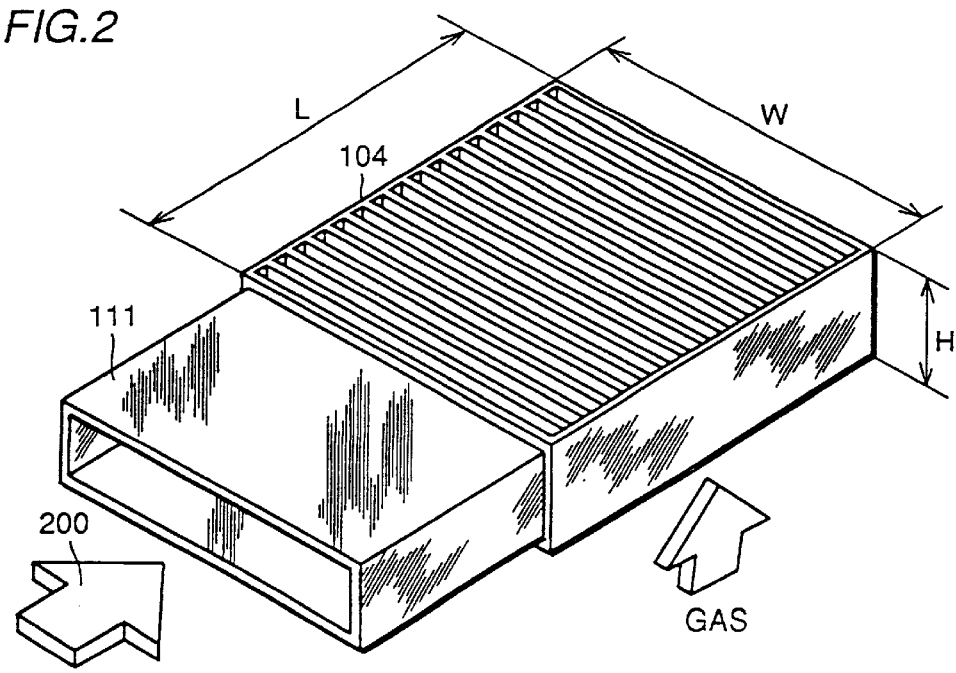
FIG. 2 is a perspective view of the structure of a gas separating portion.

As for the details of the structure of gas separating portion 104, as shown in the perspective view in FIG. 2, an electromagnetic induction tube 111 is provided for introducing electromagnetic wave 500 radiating from an electromagnetic wave generating unit 103 to gas reacting chamber 108, and the dimensions of gas separating portion 104 according to the present invention are approximately L=at most 40 cm, W=at most 40 cm and H=at most 10 cm.

Preferably, the distance (S) between wafer 1 and gas reacting camber 108 is approximately 3 mm.

Figure 3:
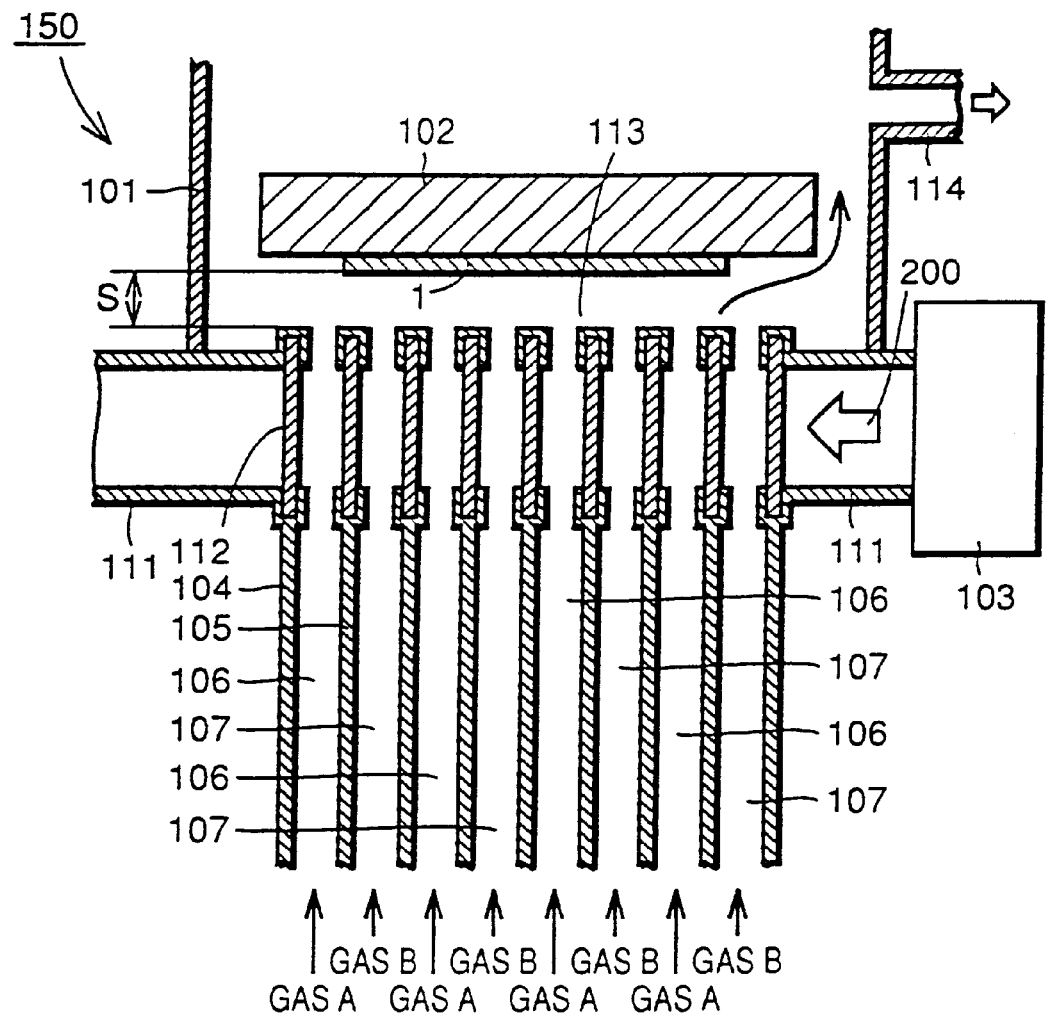
FIG. 3 is a cross sectional view of a modification of the CVD system according to the first embodiment.

Furthermore, when there is a high reactivity between gas A and gas B, it is effective to use an atmospheric pressure CVD system 150 shown in FIG. 3.

Atmospheric pressure CVD system 150 shown in FIG. 3 has the same structure as atmospheric pressure CVD system 100 shown in FIG. 1, except for the structure of gas reacting chamber 108.

In gas reacting chamber 108 of atmospheric pressure CVD system 150, gas A supplying passages 106 and gas B supplying passages 107 are also provided such that these passages are partitioned by dielectric diaphragms.

Dielectric diaphragms 112 are formed of a material capable of transmitting electromagnetic wave generated from electromagnetic wave generating unit 103, such as quarts or ceramic.

Thus, in this structure, gas A is not mixed with gas B in gas reacting chamber 108, only gas B is selectively heated by electromagnetic wave 200 radiating from electromagnetic wave generating unit 103, and gas A will not react with gas B until they reach reactive gas lead-through port 109.

Both atmospheric pressure CVD systems 100 and 150 shown in FIGS. 1 and 3, respectively, are provided with a gas exhaust passage 114 above holder 102 for exhausting gas.

An example of SiO$_2$ film formation onto wafer 1 using atmospheric pressure CVD system 100 or 150 will now be described.

The conditions of gas A, gas B and atmospheric pressure CVD system 100 are as follows:

Gas A

First reactive gas: TEOS (tetraethoxysilane) with a flow rate of 0.5 SLM (Standard Liter per Minute)

First carrier gas: Xe with a flow rate of 5.0 SLM

Gas B

Second reactive gas: H$_2$O with a flow rate of 1.0 SLM

Second carrier gas: Xe with a flow rate of 5.0 SLM

Electromagnetic Wave

Microwave with a microwave power of 200 W

Temperature of holder: 350° C.

When gas A reacts with gas B under the above conditions, the following reactions are caused:

i) $Si(OC_2H_5)_4 + H_2O \rightarrow Si(OC_2H_5)_{4-n}(OH)_n + C_2H_5OH$ (hydrolysis reaction)

ii) $Si(OC_2H_5)_{4-n}(OH)_n \rightarrow SiO_m(OH)_j(OC_2H_5)_k + H_2O$ (dehydrating condensation reaction)

iii) $SiO_2 + H_2O + C_2H_5OH$

TEOS=$Si(OC_2H_5)_4$
silanol=$Si(OC_2H_5)_{4-n}(OH)_n$
silicon polymer=$SiO_m(OH)_j(OC_2H_5)_k$ The characteristics of the film formed, when the film thickness=0.1 μm and the electric field applied=6 MV/cm are as follows wherein the term "BHF" denotes buffered hydrofluoric acid, i.e., an aqueous solution of a mixture of hydrogen fluoride (HF) and ammonium fluoride (NF$_4$F):

Growth rate of SiO$_2$: 0.5 μm/min

Flatness: ±2%

Film quality: refractive index n=1.50

Film stress (tension): 0.5×10$^9$ dyn/cm$^2$

6:3 BHF (etching rate): 0.12 μm/min

Breakdown electric field: 9.5 MV/cm

Leakage current: 200 pA/cm$^2$

The reason why only gas B, H$_2$O, is heated by microwave while the temperature of TEOS is not increased in reacting H$_2$O with TEOS is as follows: in order to provide adequate reactivity to H$_2$O, the temperature of H$_2$O need be increased to at least 600° C. On the other hand, when the temperature of TEOS is increased to at least 500° C., the following reaction proceeds by pyrolysis reaction:

$Si(OC_2H_5)_4 \rightarrow SiO_2 + C_2H_5 \cdot OH$.

In other words, when the temperature of TEOS is increased, the reaction to produce SiO$_2$ proceeds in gas phase so that the reaction to produce silanol, which is essential to planarizing the film, is restrained. Furthermore, the composition of SiO$_2$ at the film surface, which should be mainly composed of silanol polymer, includes SiO$_2$ in solid phase, resulting in degradation in fluidity and hence in flatness.

Therefore, in order to obtain adequate flatness, it is important that the temperature of $H_2O$ only is increased while that of TEOS is not increased.

The reason why $H_2O$ is heated by microwave is as follows: in order to heat only $H_2O$ while TEOS is not heated, gas introducing paths of gas A and gas B may be separated from each other, for example, so that $H_2O$ can be heated at the $H_2O$ introducing path. However, when the heating portion is distant from the wafer surface and the wafer surface is maintained at low temperature, the heated $H_2O$ is cooled between the wafer surface and the $H_2O$ heating portion and the temperature of $H_2O$ required at the wafer surface cannot be obtained.

In order to avoid this, the entire $H_2O$ gas passages up to the wafer surface may be maintained at high temperature. However, this allows the temperature of TEOS introduced onto the wafer surface to increase and the requirement that only $H_2O$ is heated cannot be satisfied.

Furthermore, the temperature of a wafer surface can be determined by the characteristic of the film formed on the wafer. For example, the temperature of the wafer surface must not exceed 450° C. in forming films in the process for aluminum multilayer interconnections.

Thus, heating by microwave is considered to be optimal as a method of only increasing the temperature of $H_2O$ at or near the wafer surface.

In the present embodiment, as described above, since the temperature of $H_2O$ only is increased to 600° C.–800° C. using microwave, dissociation of TEOS molecules is hardly caused and thus the formation reaction of the silanol required is adequately caused. Thus, an $SiO_2$ film with a superior flatness can be formed as compared with those conventionally formed.

Furthermore, since silanol is selectively formed to form an $SiO_2$ film and thus there is nothing to prevent flow of the silanol contained in the film being formed, the surface of the film being formed is mainly formed of polymer having a molecular weight which allows flow of the polymer even when the dehydrating condensation weight at the wafer is increased. Thus, enhanced flatness can be realized under a film forming condition of a temperature of 300° C.–400° C. Furthermore, since the $SiO_2$ film is continuously fired at a temperature of as high as 300° C.–400° C. during the forming of the $SiO_2$ film, a film with small leakage current and good dielectric strength can be formed with low stress.

While an example in which TEOS is used as the first reactive gas has been described, the silane compound and the organosilane compounds shown in Table 1 may be used to obtain a similar effect.

TABLE 1

| silane compound | $SiH_4$ | silane |
|---|---|---|
| | $Si_2H_6$ | disilane |
| | $Si_3H_8$ | trisilane |
| | $Si_2H_3Cl_2$ | dichlorosilane |
| organosilane compound | $Si(OC_2H_5)_4$ | TEOS tetraethoxysilane |
| | $Si(OCH_3)_4$ | TMOS tetramethoxy silane |
| | $Si(OCH_3)_2(OC_4H_9)_2$ | DADBS diacetoxydibutoxy silane |

TABLE 1-continued

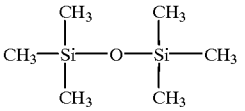

| | | HMDS hexamethyl disiloxane |
|---|---|---|
| | | HEDS hexaethyl disiloxane |
| $Si(OC_2H_5)_3H$ | | triethoxysilane |
| | | TMCTS tetramethylcyclo trisiloxane |

Furthermore, while Xe has been used as the second carrier gas for $H_2O$, $N_2$ (the mass number=28) is often used as a carrier gas for $H_2O$ in a conventional CVD system. $H_2O$ molecules heated by microwave, when colliding against the carrier gas molecules, will lose their energy and thus the $H_2O$ molecules are cooled. However, it is physically apparent that when $H_2O$ molecules collide against molecules having a relatively larger mass number, the $H_2O$ molecules lose less energy per one collision, and thus are hard to cool.

Thus, if a gas having a mass number larger than that of $H_2O$, 18, is used as the carrier gas, the heated $H_2O$ molecules are not cooled and thus reach the reaction space so that the heating of $H_2O$ by microwave is effectively used. Thus, while Xe having a mass number of 131 has been used in the present embodiment, Ar having a mass number of 40 can also be used.

Furthermore, while a signal-wafer-processing atmospheric pressure CVD system is used in the first embodiment, a batch-processing CVD system or a CVD system which continuously processes wafers may be used to obtain similar function and effect.

[Second Embodiment]

Figure 4:
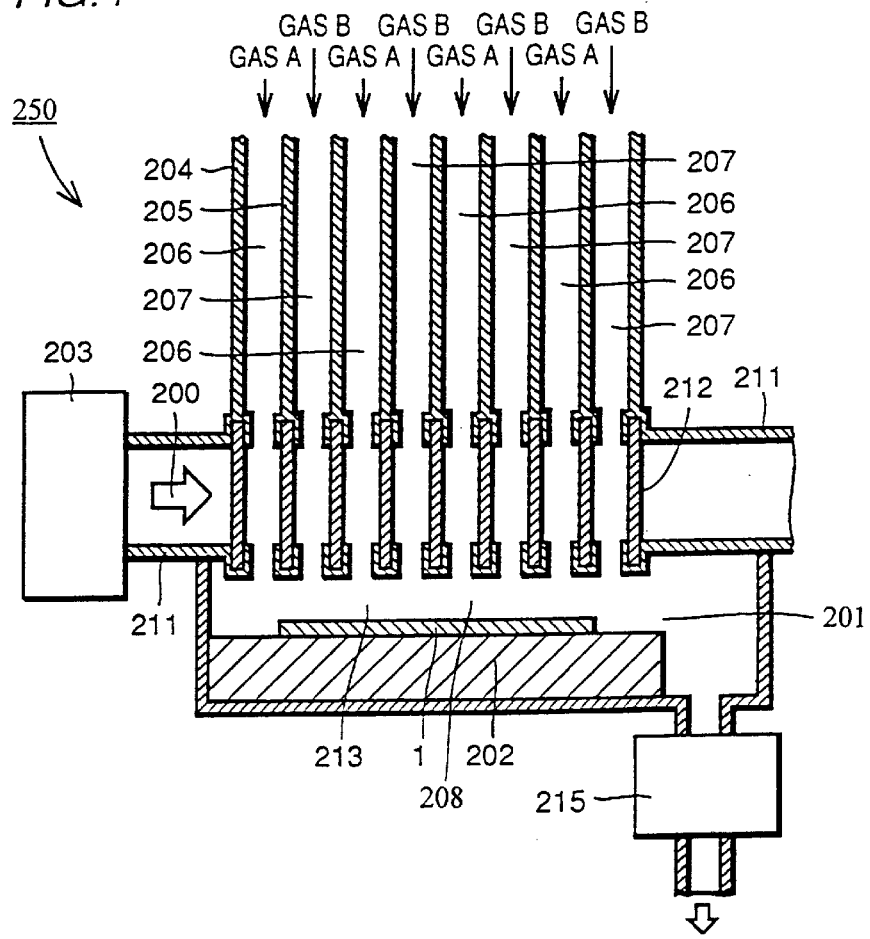
FIG. 4 is a cross sectional view of an etching system according to a second embodiment.
Figure 5:
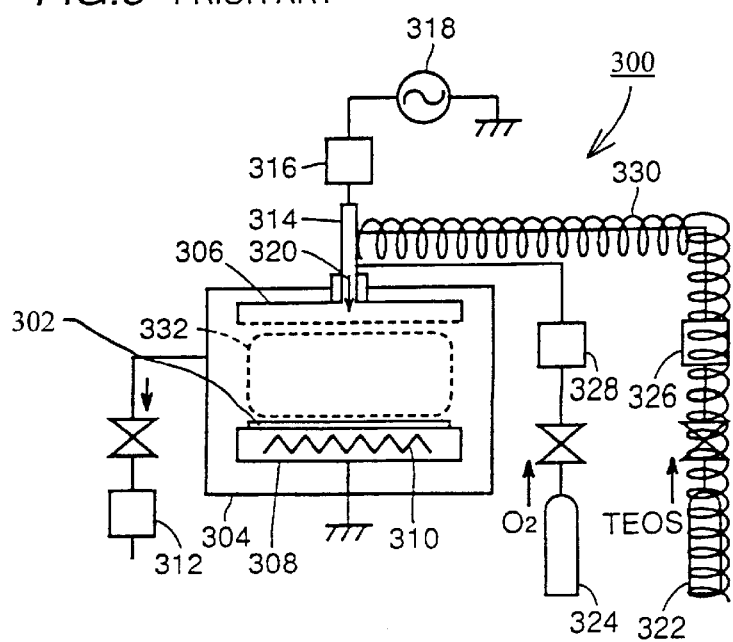
FIG. 5 is a schematic view of a structure of a conventional plasma CVD system.

An example in which a surface processing device according to the present invention is applied to an etching system will now be described with reference to FIG. 4. FIG. 4 shows the structure of an etching system 250 in cross section.

Provided within a chamber 201 is a holder 202 which supports a wafer 1. Provided above holder 202 are a reactive gas lead-through port 213 and a gas reacting chamber 208.

Provided above gas reacting chamber 208 are gas A supplying passages 206 for supplying a gas A insusceptible to heating by electromagnetic wave to gas reacting chamber 208 and gas B supplying passages 207 for supplying a gas B susceptible to heating by electromagnetic wave to gas reacting chamber 208 such that these passages are partitioned by diaphragms 205, thus providing a gas separating portion 204 with gas A supplying passages 206 and gas B supplying passages 207 alternately disposed.

In etching system 250 also, gas A supplying passages 206 and gas B supplying passages 207 are partitioned up to reactive gas lead-through port 213 by diaphragms 212 formed of a dielectric material within gas reacting chamber 208, and an electromagnetic wave generating unit 203 for radiating electromagnetic wave 200 is provided at gas reacting chamber 208. Dielectric diaphragms 212 are formed of quarts, ceramic or the like.

Provided below chamber 201 is a removal unit 215 for externally exhausting the gas sent from gas A supplying passages 206 and gas B supplying passages 207.

In the above etching system 250 also, gas B can be selectively heated in gas reacting chamber 208 by irradiating gas A and gas B with electromagnetic wave 200.

A specific example in which the above etching system 250 is used to etch an oxide film on a surface of wafer 1 will now be described.

The conditions of gas A, gas B and etching system 250 are as follows:

Gas A: $F_2$ with a flow rate of 1.0 SLM

Gas B: $H_2O$ with a flow rate of 0.1 SLM

Electromagnetic Wave: microwave with a microwave power of 20 W

Temperature of wafer: 100° C.

When gas A reacts with gas B under the above conditions, the following reaction is caused:

$$F_2 + H_2O \rightarrow HF + O_2.$$

The result of the etching is as follows: the etching rate is 1.0 $\mu$m/min for a BPSG film and 0.01 $\mu$m/min for a thermal oxide film.

Thus, selective etching of oxide films by using HF anhydride can be applied. Since oxide films can be selectively etched without using HF vapor, the gas introducing passages need not be corrosion-resistant. This allows safe, selective etching of oxide films.

The reason why the temperature of $H_2O$ only is increased while that of $F_2$ is not increased is that the above reaction fails to materialize when the temperature of $H_2O$ is low and that the above reaction materializes when the temperature of $H_2O$ is at least 400° C.

On the other hand, when the temperature of $F_2$ is increased, F radicals are produced and the pipes for the gas introduction system are undesirably eroded.

Thus, it becomes possible to cause the above reaction safely by selectively increasing the temperature of $H_2O$.

In a surface processing device according to the present invention, when a gas containing TEOS is used as the first gas and a gas containing $H_2O$ is used as the second gas, only the second gas, $H_2O$, can be selectively heated near a surface of an object to be processed by microwave generated from an electromagnetic wave generating unit. Consequently, since dissociation of molecules of the first gas, TEOS, is hardly caused, it is ensured that silanol is produced as an intermediate and thus an $SiO_2$ film having good flatness can be formed. Furthermore, since the $SiO_2$ is continuously fired during the film formation, a $SiO_2$ film with small leakage current and good dielectric strength can be formed.

Furthermore, when a gas containing $F_2$ gas is used as the first gas and a gas containing $H_2O$ is used as the second gas, only the second gas, $H_2O$, can be selectively heated by microwave generated from the electromagnetic wave generating unit, allowing selective etching of oxide films using HF anhydride rather than HF vapor.

In the method of processing a surface according to the present invention, when TEOS as an organosilane compound is used as the first reactive gas, $H_2O$ is used as the second reactive gas and a noble gas is used as the first and second carrier gases, only the second reactive gas, $H_2O$, can be selectively heated, for example, by microwave generated from the electromagnetic wave generating unit. Consequently, since dissociation of molecules of the first reactive gas, TEOS, is hardly caused, it is ensured that silanol is produced as an intermediate and thus a $SiO_2$ film having good flatness can be formed. Furthermore, since the $SiO_2$ is continuously fired during the film formation, a $SiO_2$ film with small leakage current and good dielectric strength can be formed.

Furthermore, in the above method of processing a surface, a noble gas such as argon, xenon or the like having a mass number larger than that of $H_2O$ may be used as the second carrier gas so that energy loss of the heated $H_2O$ molecules due to collision against molecules of the noble gas can be reduced and thus the $H_2O$ molecules, without being cooled, can reach the reaction space near the object to be processed.

On the other hand, when a gas containing $F_2$ gas is used as the first gas and a gas containing $H_2O$ is used as the second gas, the second gas, $H_2O$, can be selectively heated by microwave generated by the electromagnetic wave generating unit, allowing selective etching of oxide films using HF anhydride rather than HF vapor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of processing a surface of an object, comprising the steps of:

supplying a first gas, unsusceptible to heating by electromagnetic wave, through first gas supplying passages to near the surface of said object in an atmosphere under atmospheric pressure;

separately supplying a second gas, susceptible to heating by electromagnetic wave, through second gas supplying passages to near the surface of said object;

selectively heating only said second gas by irradiating said first gas and said second gas with electromagnetic wave; and processing the surface of said object by reaction between said first gas and said heated second gas.

2. The method of processing a surface according to claim 1, wherein said selective heating step is performed with said first gas and said second gas being separated from each other.

3. The method of processing a surface according to claim 1, wherein said selective heating step is performed with said first gas and said second gas being mixed.

4. The method of processing a surface according to claim 1, wherein said first gas contains a first reactive gas reacting on said second gas, and a first carrier gas not reacting with said second gas, and wherein said second gas contains a second reactive gas reacting on said first gas, and a second carrier gas not reacting with said first gas.

5. The method of processing a surface according to claim 4, wherein said surface processing step includes forming a film on the surface of said object to be processed.

6. The method of processing a surface according to claim 5, wherein said first reactive gas is either a silane compound or an organosilane compound.

7. The method of processing a surface according to claim 6, wherein said silane compound is at least one material selected from the group consisting of silane, disilane, trisilane and dichlorosilane.

8. The method of processing a surface according to claim 6, wherein said organosilane compound is at least one material selected from the group consisting of tetraethoxysilane, tetramethoxysilane, diacetoxydibutoxysilane, hexamethyldisiloxane, hexaethyldisiloxane, triethoxysilane and tetramethylcyclotrisiloxane.

9. The method of processing a surface according to claim 5, wherein said second reactive gas is $H_2O$.

10. The method of processing a surface according to claim 1, wherein said electromagnetic wave is microwave.

11. The method of processing a surface according to claim 1, wherein said surface processing step includes etching the surface of said object to be processed.

12. The method of processing a surface according to claim 11, wherein said first gas is $F_2$ gas and said second gas is $H_2O$ gas.

* * * * *